(12) United States Patent
Thelen et al.

(10) Patent No.: US 7,425,862 B2
(45) Date of Patent: Sep. 16, 2008

(54) DRIVER CIRCUIT THAT EMPLOYS FEEDBACK TO ENABLE OPERATION OF OUTPUT TRANSISTOR IN TRIODE REGION AND SATURATION REGION

(75) Inventors: Robert Thelen, Fort Collins, CO (US); Robert Elsheimer, Fort Collins, CO (US); Brian J. Misek, Fort Collins, CO (US)

(73) Assignee: Avago Technologies ECBU IP (Singapore) Pte Ltd, Singapore (SG)

( * ) Notice: Subject to any disclaimer, the term of this patent is extended or adjusted under 35 U.S.C. 154(b) by 709 days.

(21) Appl. No.: 10/915,795

(22) Filed: Aug. 10, 2004

(65) Prior Publication Data

US 2006/0033536 A1 Feb. 16, 2006

(51) Int. Cl.
*G05F 1/10* (2006.01)
*G05F 3/02* (2006.01)

(52) U.S. Cl. .................................... 327/543

(58) Field of Classification Search ............... 327/538, 327/543, 108, 540–541; 323/315
See application file for complete search history.

(56) References Cited

U.S. PATENT DOCUMENTS

| 6,686,771 | B1 * | 2/2004 | Erhart ........................ 326/81 |
| 6,690,229 | B2 * | 2/2004 | Rudolph ..................... 327/543 |
| 6,753,724 | B2 * | 6/2004 | Hanson ...................... 327/543 |
| 6,894,556 | B2 * | 5/2005 | Kawasumi .................. 327/541 |
| 7,109,785 | B2 * | 9/2006 | Derksen ..................... 327/543 |
| 2004/0017249 | A1 * | 1/2004 | Engl ........................... 327/543 |

* cited by examiner

*Primary Examiner*—Quan Tra (57) ABSTRACT

Driver circuit that generates an output drive signal that can be used to drive a light source (e.g., a light emitting diode (LED)) is described. The driver circuit includes an output transistor that operates in either a saturation region or a triode region. The driver circuit employs feedback to generate an output drive signal (e.g., an output drive current) that is independent on the operating mode of the output transistor.

11 Claims, 7 Drawing Sheets

DRIVER CIRCUIT THAT EMPLOYS FEEDBACK TO ENABLE OPERATION OF OUTPUT TRANSISTOR IN TRIODE REGION AND SATURATION REGION

BACKGROUND OF THE INVENTION

Portable applications have a limited power supply, such as a battery. Consequently, power conservation and efficiency are more important in the design of portable applications than in applications (e.g., a desktop application) that are connected to a virtually unlimited power supply (e.g., wall outlet).

From a digital designer's perspective, the simple and obvious manner to save power is to decrease the supply voltage for the digital circuits. However, for analog circuits, a reduced power supply voltage often introduces severe design constraints and challenges. For example, an analog design circuit that operates well at a particular power supply voltage may fail to operate in a desired manner or to meet design requirements when the power supply voltage is decreased.

One important circuit is a driver circuit for driving light emitting diodes (LEDs). LEDs are found in many portable applications including back lighting, displays (e.g., for cellular telephones, laptop computers, personal digital assistants (PDAs), etc.).

Figure 1:
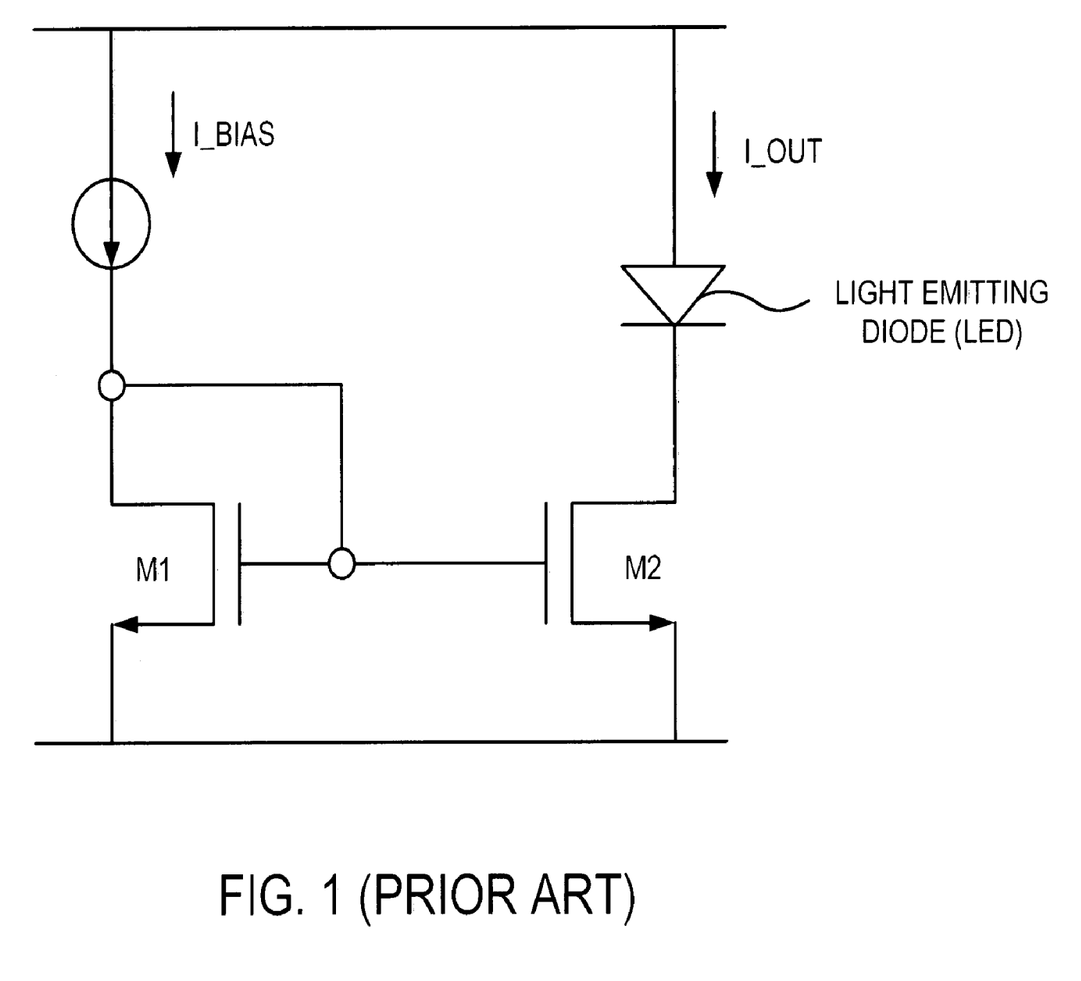
FIG. 1 illustrates a prior art light emitting diode (LED) driver.
Figure 2:
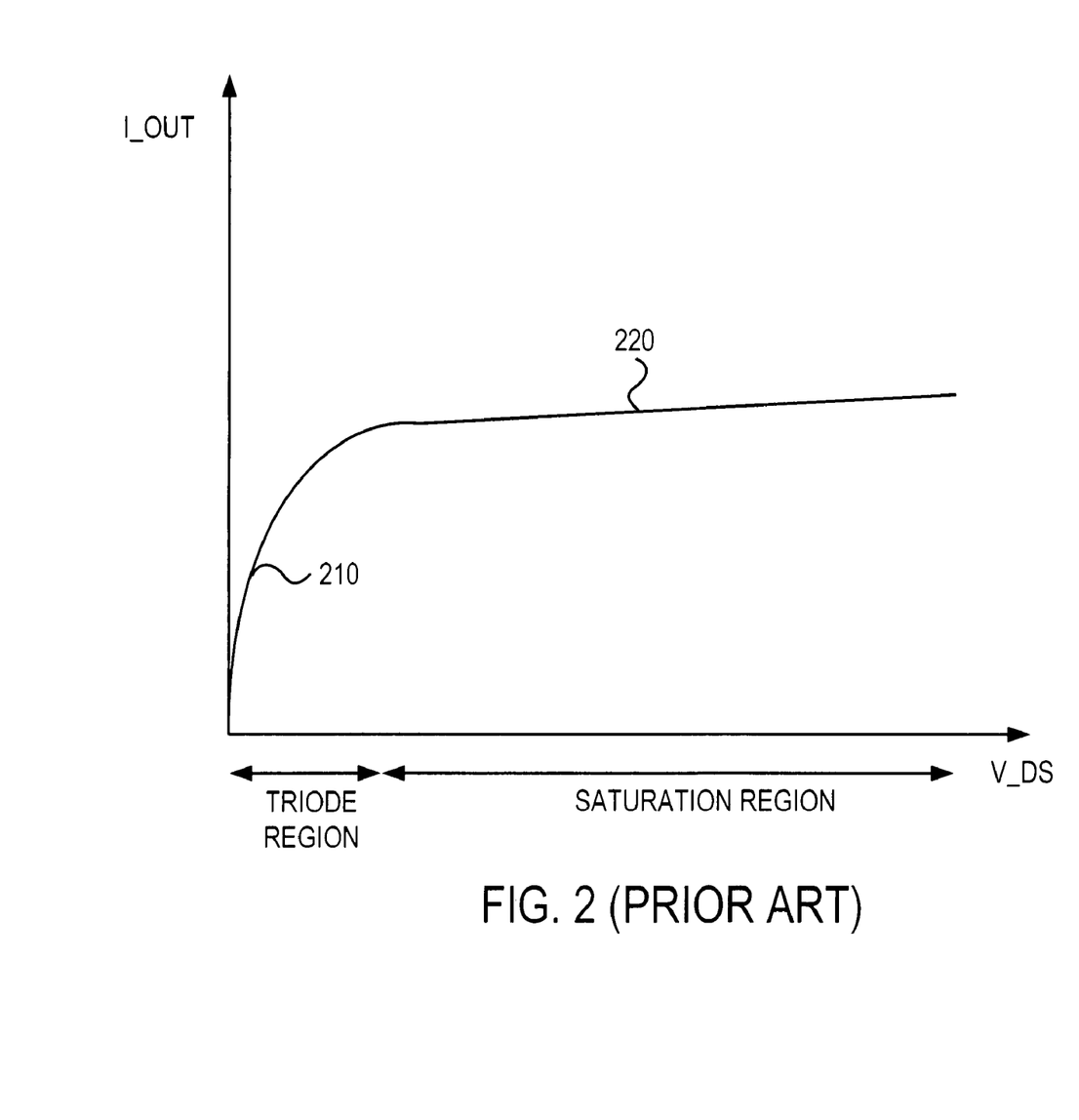
FIG. 2 illustrates a I_out versus V_ds graph of transistor M2 of FIG. 1.

In a typical system that has a 5V supply voltage, a current mirror is utilized as a LED driver. FIG. 1 illustrates such an approach. The output current (I_out) provided to the LED is a mirror ratio of the input bias current (I_bias). In the ideal case, the output current (I_out) is constant while the M2 transistor operates in a saturation region. However, when the M2 transistor operates in a triode region, the output current drops rapidly with a decreasing drain to source voltage (V_ds). This is illustrated in the I_out versus V_ds graph of FIG. 2. It is noted that the output impedance of the M2 transistor can also affect the output current (I_out) when the M2 transistor is operating in the saturation region.

To minimize the effect of the output impedance on the output current (I_out), the current mirror is not designed with a minimum transistor length. Increasing the device length improves current tolerance because the output impedance increases. However, increasing the device length of the M2 transistor also increases the saturation voltage.

It is noted that since the minimum supply voltage is the saturation voltage of the M2 transistor plus the forward voltage of the LED, increasing the channel length of the transistors tends to limit the minimum supply voltage.

Based on the foregoing, there remains a need for a driver circuit for applications with low power voltage supplies that overcomes the disadvantages set forth previously.

SUMMARY OF THE INVENTION

According to one embodiment of the present invention, a driver circuit that generates an output drive signal that can be used to drive a light source (e.g., a light emitting diode (LED)) is described. The driver circuit includes an output transistor that operates in one of a saturation region and a triode region. The driver circuit employs feedback to generate an output drive signal (e.g., an output drive current) that is independent of the operating mode of the output transistor.

According to another embodiment of the present invention, a driver circuit for generating an output drive signal that can be used to drive a light source (e.g., a light emitting diode (LED)) is described. The driver circuit includes an output transistor that operates in either a saturation region or a triode region and generates an output drive signal (e.g., an output drive current). The driver circuit employs a mechanism coupled to the output transistor that receives the output drive signal and a bias signal and selectively adjusts the output drive signal based on a bias signal.

According to another embodiment of the present invention, the driver circuit includes a first feedback loop to sense the output drive signal (e.g., output drive current) and to generate a replica signal (e.g. a replica current) based on the output drive signal. The driver circuit also includes a second feedback loop that utilizes the replica signal and a bias signal (e.g., a bias current) to selectively adjust the output drive signal (e.g., output drive current).

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A driver circuit that generates an output signal that can be used to drive a light source (e.g., a light emitting diode (LED)) is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The driver circuit according to the invention generates an output drive signal (e.g., an output drive current) that drives a light source (e.g., a light emitting diode (LED) or a semiconductor laser). The driver circuit includes an output transistor that operates in different operating regions (e.g., saturation region and triode region). The driver circuit according to the invention generates an output drive signal (e.g., an output drive current, I_out) that is independent of operating region of the output transistor. Specifically, the circuit driver according to the invention employs feedback to provide an output drive signal (e.g., output drive current) that is independent of the operating region of the output transistor.

Driver Circuit 300

Figure 3:
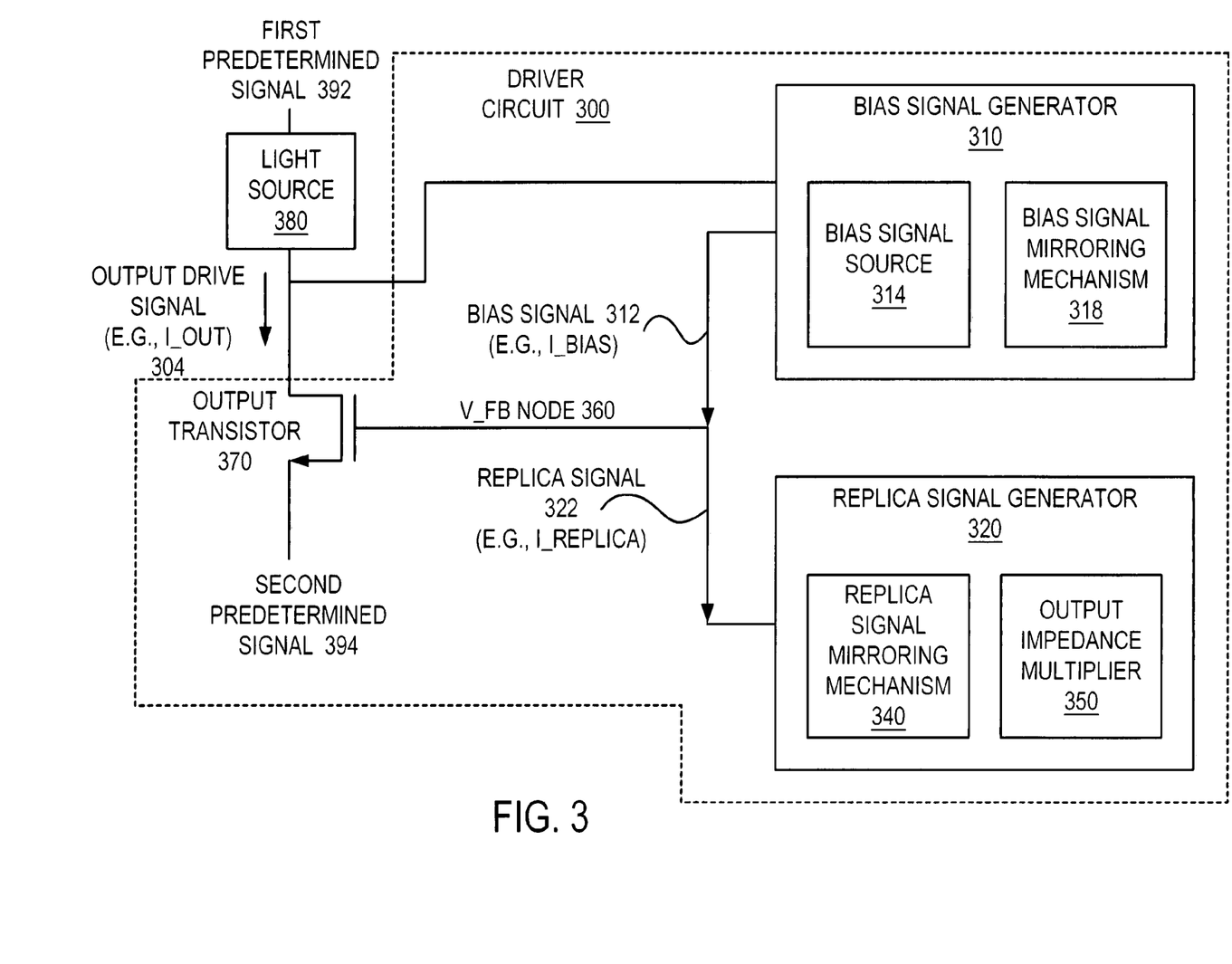
FIG. 3 illustrates a block diagram of the driver circuit according to one embodiment of the invention.

FIG. 3 illustrates a block diagram of a driver circuit 300 according to one embodiment of the invention that can be utilized to provide a drive signal 304 to a light source 380, for example. The driver circuit 300 includes an output transistor 370 that generates an output drive signal 304 (e.g., an output drive current, I_out).

The driver circuit 300 includes a bias signal generator 310 that generates a bias signal 312 (e.g., a bias current, I_bias) and a replica signal generator 320 that generates a replica signal 322 (e.g., a replica current, I_replica). The bias signal generator 310 is coupled to a feedback node 360 (V_fb) and provides the bias signal 312 (e.g., I_bias) to the feedback node 360 (V_fb). The bias signal generator 310 includes a bias signal source 314 and a bias signal mirroring mechanism 318. The bias signal source 314 can be, for example, a current source that generates a bias current (e.g., I_bias). The mirroring mechanism 318 is coupled to the bias signal generator 310 to receive the bias signal 312 and mirrors the bias signal 312 to the feedback node 360. In one embodiment, the mirroring mechanism 318 is implemented with transistors M1, M2, M3, M4, M5, M6, M7, M8, M9, M10, M11, M12, M15, and M16, illustrated in FIG. 4.

The replica signal generator 320 is also coupled to a feedback node 360 (V_fb) and provides the replica signal 322 (e.g., I_replica) to the feedback node 360 (V_fb). The replica signal generator 320 generates a replica signal 322 (e.g., I_bias) based on the output drive signal 304 of the output transistor 370. In one embodiment, the replica signal generator 320 is implemented with transistor M21 and amplifier (OA1) illustrated in FIG. 4.

The replica signal generator 320 includes a replica mirroring circuit 340 that mirrors the replica signal 322 generated by the replica signal generator 320 to the feedback node 360 (V_fb). In one embodiment, the replica mirroring circuit 340 is implemented with transistors M13, M14, M17, M18, M19, M20, M22 and M23 illustrated in FIG. 4.

It is noted that a first predetermined signal 392 is coupled to the light source 380, and a second predetermined signal 394 is coupled to the source electrode of the output transistor 370. The first predetermined signal 392 may be a power supply signal (e.g., V_DD) and may also be coupled to transistors of the bias signal generator 310 and the replica signal generator 320. The second predetermined signal 394 may be a ground signal (e.g., V_GND) and may be coupled to transistors of the bias signal generator 310 and the replica signal generator 320.

The driver circuit 300 also includes a first feedback loop (hereinafter also referred to as the "inner loop") and a second feedback loop (hereinafter also referred to as the "outer loop"). The first loop or inner loop senses the output drive signal 304 (e.g., output drive current, I_out) and creates a replica current 322. The second loop or outer loop employs the replica current 322 and a bias current 312 to set the output drive signal 304 (e.g., output drive current).

The driver circuit 300 according to the invention employs feedback to provide an output drive signal 304 (e.g., a output drive current, I_out) that is independent on the output transistor's 370 operating regions. Specifically, the driver circuit 300 according to one embodiment of the invention employs two feedback loops to enable the output transistor 370 (e.g., transistor M24 of FIG. 4) to operate in both the saturation region and the triode region.

By enabling the output transistor 370 (e.g., transistor M24 of FIG. 4) to operate in the triode region, the minimum supply voltage required for operation of the driver circuit is decreased, thereby saving power.

Output Impedance Multiplier 350

Figure 4:
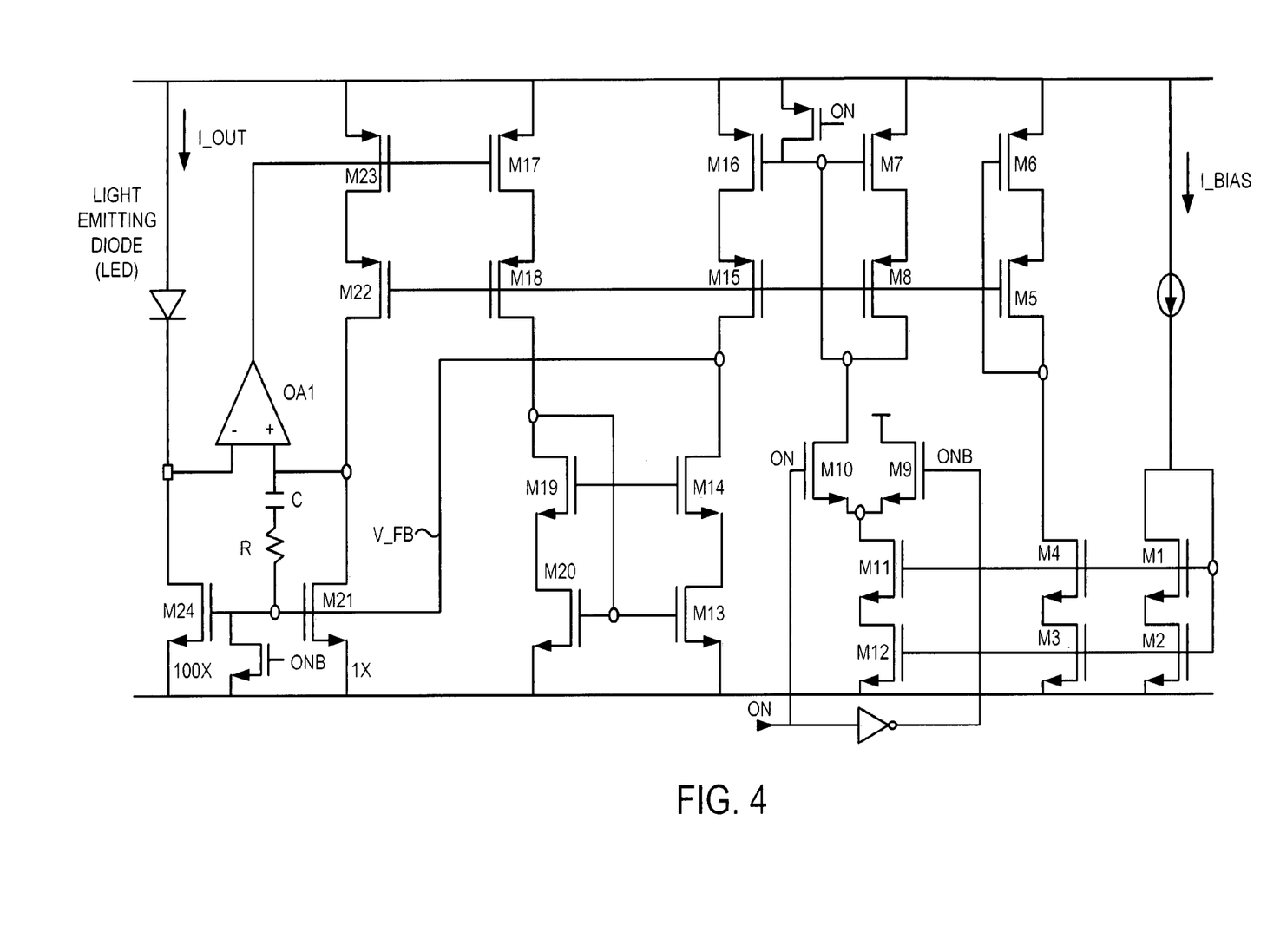
FIG. 4 is a circuit diagram of an exemplary implementation of the driver circuit of FIG. 3 according to one embodiment of the invention.

The driver circuit 300 includes an output impedance multiplier 350 that multiplies the effective output impedance "seen" looking into the drain electrode of transistor M24. Consider an application in which an output impedance of 10,000 ohms (10 k) is required. Without the output impedance multiplier 350 according to the invention, a designer must adjust the length of the gate of transistor M24 to achieve the desired or target output impedance. For example, the gate length of transistor M24 can be selected to be 10 microns to achieve the target impedance. However, as can be appreciated, using the gate length alone to meet a target impedance has the undesirable effect of increasing the gate width and increasing the total area needed to realize the output transistor.

The output impedance multiplier 350 according to the invention multiplies the effective output impedance "seen" looking into the drain electrode of transistor M24 by the open loop gain of the operational amplifier. In this manner, the length of the gate can be many times smaller than the length of the gate required to achieve the same target output impedance. For example, when the operational amplifier has an open loop gain of 100, the gate length of the output transistor M24 can be considerably less than the gate length of an output transistor without the output impedance multiplier 350. In one example, the gate length of output transistor M24 is about 5 times less than the gate length of an output transistor without the output impedance multiplier 350. It is noted that a smaller gate length leads to a smaller gate width, thereby resulting in a smaller area need to realize the output transistor M24.

The effective output impedance may be determined from the following expression:

Effective Output Impedance=Output Impedance of Output Transistor*Open Loop Gain of Amplifier where the output impedance of the output transistor 370 is the output impedance provided by selection of a predetermined gate length of output transistor M24.

The output impedance multiplier 350 according to the invention provides flexibility for a circuit designer in achieving a target output impedance.

Furthermore, the feedback loops increase the "apparent" output impedance looking into the drain electrode of output transistor 370, thereby allowing shorter device lengths and consequently smaller widths for the output transistor 370. Smaller gate lengths and widths enable reduced area and self-capacitance. For example, decreasing the self-capacitance of the output transistor 370 allows for lower power drive circuits.

Exemplary Circuit Implementation

FIG. 4 is a circuit diagram of an exemplary implementation of the driver circuit 300 of FIG. 3 according to one embodiment of the invention. The output transistor M24 includes a drain electrode that is coupled to the light source. The output transistor M24 includes a gate electrode that is coupled to the gate electrode of transistor M21 and a positive terminal of amplifier OA1. The output transistor M24 includes a source electrode that is coupled to the second predetermined signal 394 (e.g., a ground potential). In one embodiment, the W/L ratio for transistor M24 is about 5 times the W/L ratio for transistor M21.

The first loop circuit (also referred to herein as an inner loop circuit) includes an operational amplifier (OA1), transistor M23, transistor M22, and transistor M21. The first loop circuit measures a replica signal (e.g., I_replica) through transistor M21. The replica signal is a scaled version of the output drive signal (e.g., I_out) of transistor M24. It is noted that the replica signal is utilized to selectively adjust the output drive signal of transistor M24.

The first loop circuit employs the amplifier (OA1) to force the signal at the drain electrode of transistor M21 to equal the signal at the drain electrode of transistor M24. When the signals at the drains of transistors M21 and M24 are equal, and when the gate of transistor M21 and the gate of transistor M24 are connected, transistor M21 senses a replica signal (e.g., replica current) based on the output drive signal (e.g., output drive current) through transistor M24. The replica signal is mirrored around and arrives at transistor M14, where the replica signal (e.g., replica current) meets the bias signal (e.g., bias current) from transistor M15.

The second loop circuit (also referred to herein as an outer loop circuit) includes transistor M17, transistor M18, transistor M19, transistor M20, transistor M13, transistor M14, transistor M15, transistor M16, and transistor M21. The second loop circuit is utilized to force the output drive signal to a multiple of the bias signal (e.g., I_bias).

When the bias signal (e.g., bias current) is greater than the replica signal (e.g., replica current), the signal at the feedback node (V_fb) increases (e.g., the voltage signal at V_fb increases), thereby increasing the output signal to a target output signal (e.g., a target output drive current). The target output drive current is then employed to drive the light source (e.g., light emitting diode, laser, etc.). When the bias signal (e.g., bias current) is less than the replica signal (e.g., replica current), the signal at the feedback node (V_fb) decreases (e.g., the voltage signal at V_fb decreases), thereby decreasing the output drive signal to a target output drive signal (e.g., target output drive current).

The stability of the driver circuit 300 depends on the stability of the first loop circuit and the second loop circuit. In this regard, the driver circuit 300 includes a stability mechanism that maintains the stability of the first loop circuit and the second loop circuit. In one embodiment, the stability mechanism includes a resistor and capacitor coupled to the non-inverting input of the operation amplifier (OA1).

It is noted that transistors M9 and M10 are utilized to turn the drive circuit 300 on or off. The ON signal can be a digital signal that may be utilized to turn the drive circuit 300 on or off (e.g., turn on and off the output signal (I_out)). ONB is the complement of the ON signal (e.g., an inverted version of the ON signal). It is noted that the transistors can be field effect transistors (FETs), bipolar transistors (BJT), and other types of transistors. In one embodiment, the current through transistor M24 is about 100 times the current through transistor M21.

Figure 5:
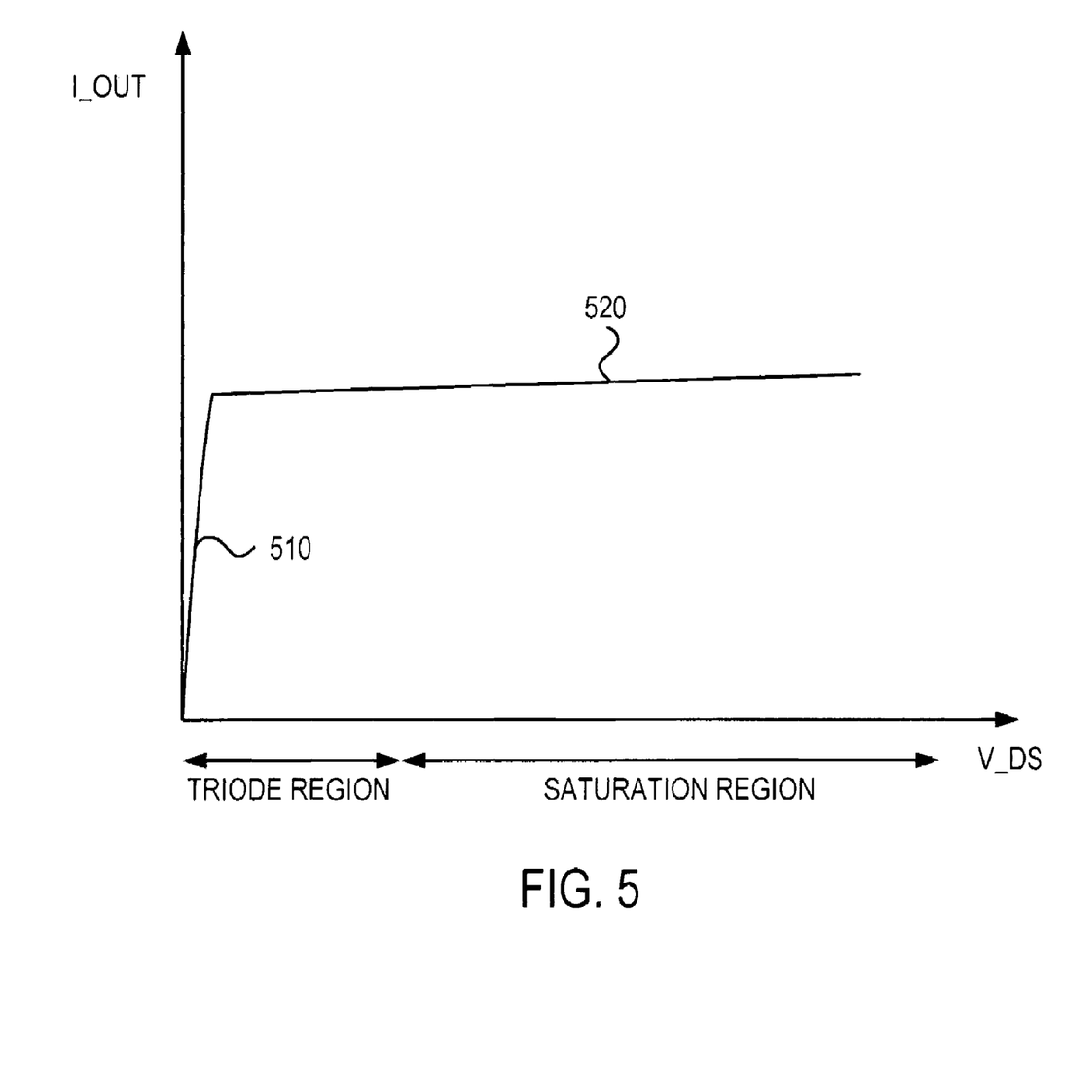
FIG. 5 illustrates a I_out versus V_ds graph of the driver circuit of FIG. 3.

FIG. 5 illustrates a I_out versus V_ds graph of the output transistor of a driver circuit of FIG. 3. It is noted that the output transistor operates in both a triode region 510 and a saturation region 520. Moreover, the output drive signal (e.g., the output drive current) is provided in both the triode region 510 and the saturation region 520. Unlike the prior art drivers that operate only in the saturation region (e.g., the drive current has a linear response in the triode region), the I_out versus V_ds graph of the output transistor of a driver circuit according to the invention, the response of the output signal has a very steep rise from 0 to a predetermined plateau level (e.g., a target drive current) in the triode region 510.

Optical Navigation Device 600

Figure 6:
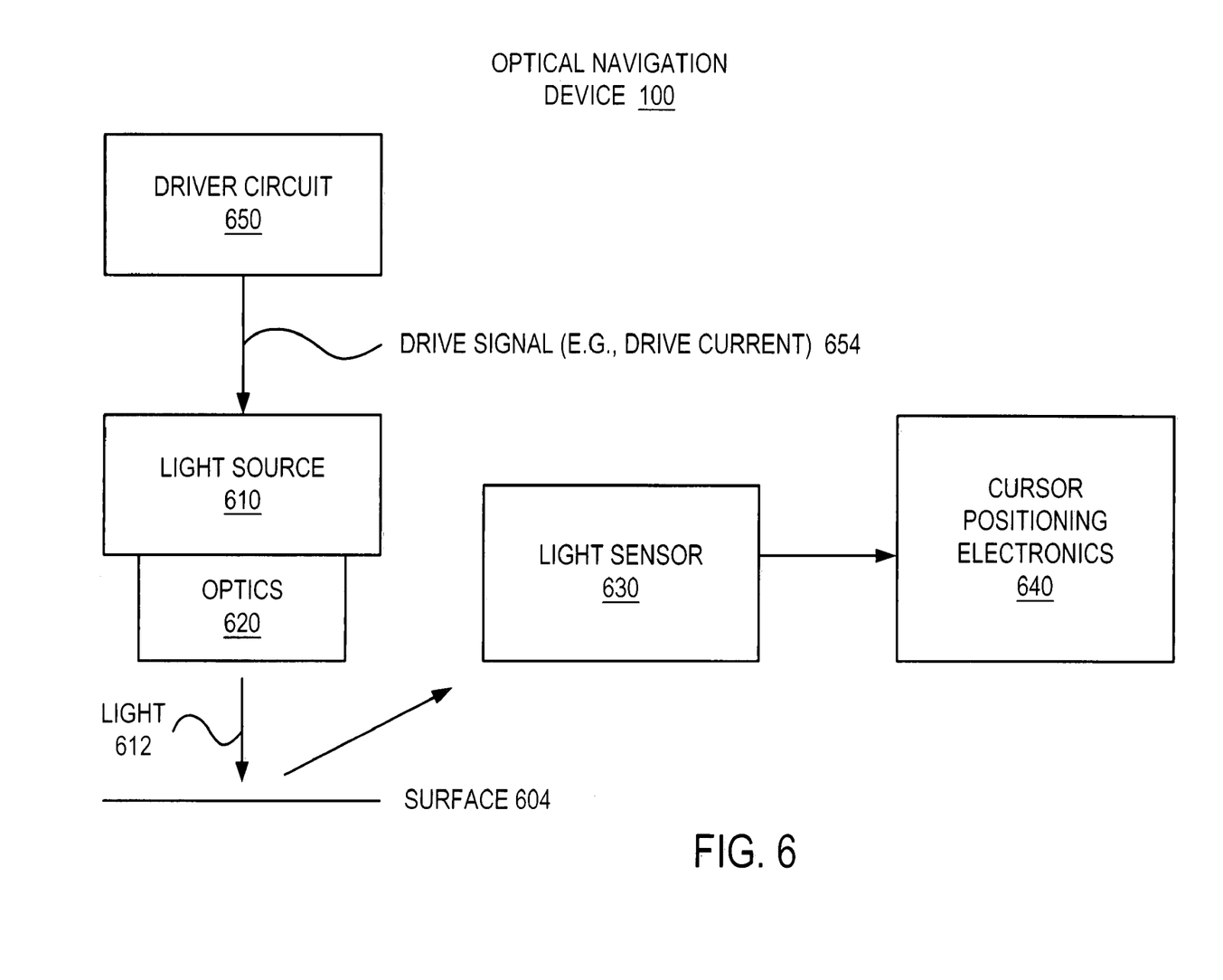
FIG. 6 illustrates an optical navigation device in which the driver circuit according to the invention can be incorporated.

FIG. 6 illustrates an optical navigation device 600 in which the driver circuit according to the invention can be incorporated. Optical navigation device 600 (which is commonly referred to also as an "optical mouse") includes a light source 610 that generates light 612, optics 620 for focusing the generated light 612 onto a surface 604 (e.g., a surface of a table or mouse pad), a light sensor 630 for receiving light reflected from the surface, and electronics 640 that provides cursor positioning functions based on the received light. The light source 610 can be, for example, one or more light emitting diodes (LEDs), a laser (e.g., a semi-conductor laser), or other light source. As can be appreciated, the light source 610 requires a drive signal 654 (e.g., a drive current) to operate. In this regard, the device 600 includes a driver circuit 650 that provides the drive signal 654 (e.g., the drive current) to the light source 610. The driver circuit 650 can be, for example, a driver circuit according to the invention.

Driver Circuit Processing

Figure 7:
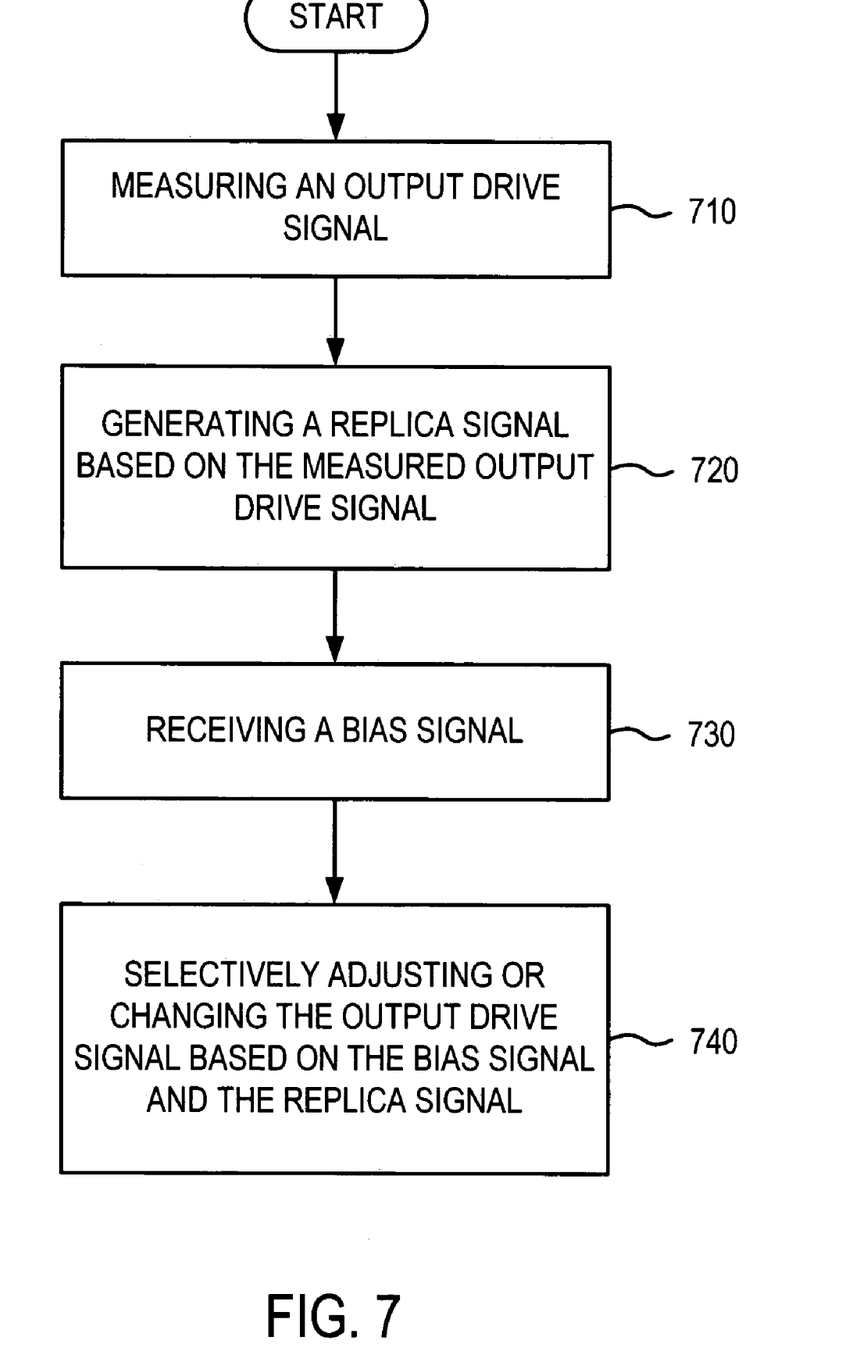
FIG. 7 is a flowchart illustrating the processing steps performed by the driver circuit according to one embodiment of the invention.

FIG. 7 is a flowchart illustrating the processing steps performed by the driver circuit according to one embodiment of the invention. According to one embodiment of the invention, a method for providing an output drive signal is described. In step 710, an output drive signal is measured. For example, an output drive current generated by an output transistor is measured. In step 720, a replica signal is generated based on the measured output drive signal. Step 720 can include the substeps of generating the replica signal and mirroring the bias signal to a predetermined node (e.g., a feedback node). In step 730, a bias signal is received. Step 730 can include the substeps of generating the bias signal and mirroring the bias signal to a predetermined node (e.g., a feedback node). In step 740, the output drive signal is selectively adjusted or changed based on the bias signal and the replica signal. Step 740 can include increasing the output drive signal or decreasing the output drive signal. For example, when the output drive signal is an output drive current for driving a light source, the output drive current can be selectively increased or decreased depending on the bias signal (e.g., a bias current) and the replica signal (e.g., a replica current).

Low Power Applications

In one embodiment, the driver circuit according to the invention is utilized in low voltage applications (e.g., portable applications or battery powered applications). For low voltage applications, the driver circuit enables the output transistor to operate in the triode region, thereby reducing the minimum power supply voltage needed to operate the driver circuit.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A driver circuit that generates an output drive signal comprising:
   an output transistor that operates in one of a saturation region and a triode region and that generates an output drive signal; and
   a mechanism coupled to the output transistor that receives the output drive signal and a bias signal and selectively adjusts the output drive signal based on the bias signal;
   a first feedback loop that senses the output drive signal and generates a replica signal based on the output signal drive; and
   a second feedback loop that employs the replica signal and the bias signal to selectively adjust the output drive signal.

2. A driver circuit that generates an output signal comprising:
   an output transistor that operates in one of a saturation region and a triode region; and
   wherein the driver circuit employs feedback to generate the output drive signal that is independent of the operating mode of the output transistor.

3. The driver circuit of claim 2 further comprising:
   a first feedback loop that senses the output drive signal and generates a replica signal based on the output drive signal; and a second feedback loop that employs the replica signal and a bias signal to selectively adjust the output drive signal.

4. The driver circuit of claim 2 further comprising:
a bias signal generator that generates a bias signal at a first node in the driver.

5. The driver circuit of claim 4 wherein the bias signal generator includes a bias signal source that generates the bias signal.

6. The driver circuit of claim 4 wherein the bias signal generator includes a bias signal mirroring mechanism that mirrors the bias signal to the first node.

7. The driver circuit of claim 2 further comprising:
a replica signal generator that generates a replica signal at a first node in the driver.

8. The driver circuit of claim 7 wherein the replica signal generator includes
a replica signal mirroring mechanism that mirrors the replica signal to the first node.

9. The driver circuit of claim 2 wherein the driver circuit generates an output drive signal that can be utilized to drive one of a light source, a light emitting diode (LED), and a laser.

10. The driver circuit of claim 2 wherein the driver circuit is utilized in one of a portable application and a battery-powered application; wherein the driver circuit enables the output transistor to operate in the triode region and to operate with a power supply voltage lower than the power supply voltage needed to operate the driver circuit when the output transistor is operating in saturation mode.

11. A method for providing an output drive signal comprising:
 a) measuring output drive signal;
 b) generating a replica signal based on the output drive signal;
 c) receiving a bias signal;
 d) selectively adjusting the output drive signal based on the bias signal and the replica signal.

* * * * *